(12) United States Patent
Khursheed

(10) Patent No.: US 9,093,243 B2
(45) Date of Patent: Jul. 28, 2015

(54) GUN CONFIGURED TO GENERATE CHARGED PARTICLES

(71) Applicant: NATIONAL UNIVERSITY OF SINGAPORE, Singapore (SG)

(72) Inventor: Anjam Khursheed, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 14/284,128

(22) Filed: May 21, 2014

(65) Prior Publication Data

US 2014/0346368 A1 Nov. 27, 2014

Related U.S. Application Data

(60) Provisional application No. 61/826,570, filed on May 23, 2013.

(51) Int. Cl.
| | |
|---|---|
| *H01J 37/26* | (2006.01) |
| *H01J 3/18* | (2006.01) |
| *H01J 3/20* | (2006.01) |
| *H01J 3/02* | (2006.01) |

(52) U.S. Cl.
CPC . *H01J 3/18* (2013.01); *H01J 3/021* (2013.01); *H01J 3/027* (2013.01); *H01J 3/20* (2013.01); *H01J 37/26* (2013.01)

(58) Field of Classification Search
CPC ......... H01J 37/063; H01J 37/07; H01J 37/06; H01J 37/10; H01J 37/21

USPC ......... 250/306, 307, 310, 492.1, 423 R, 424, 250/396 ML
See application file for complete search history.

(56) References Cited

U.S. PATENT DOCUMENTS

| | | | | | |
|---|---|---|---|---|---|
| 3,270,233 | A | * | 8/1966 | Dietrich | 313/414 |
| 4,122,347 | A | * | 10/1978 | Kovalsky et al. | 250/423 R |
| 4,620,102 | A | * | 10/1986 | Watanabe et al. | 250/427 |
| 4,710,283 | A | * | 12/1987 | Singh et al. | 204/298.01 |
| 4,721,889 | A | * | 1/1988 | Seidel et al. | 315/111.81 |
| 5,481,157 | A | * | 1/1996 | Takahashi | 313/409 |
| 5,483,074 | A | * | 1/1996 | True | 250/423 R |
| 5,675,606 | A | * | 10/1997 | Brainard et al. | 315/111.71 |
| 6,864,485 | B2 | * | 3/2005 | Kahn et al. | 250/396 R |
| 7,425,703 | B2 | * | 9/2008 | Nakasuji et al. | 250/310 |
| 7,838,839 | B2 | * | 11/2010 | Desieres et al. | 250/396 R |

* cited by examiner

*Primary Examiner* — David A Vanore
(74) *Attorney, Agent, or Firm* — Joseph G. Chu; Vie Y. Lin; Innovation Capital Law Group, LLP

(57) ABSTRACT

A gun configured to generate charged particles, comprising a ring-cathode (200) electrically configured to generate a charged particle beam; a lens arranged to focus the charged particle beam on a specimen; and at least one correction focusing electrode (1406) arranged to generate at least one electrostatic/magnetic field to further divergently/convergently focus the charged particle beam for correcting in-plane geometric aberrations associated with the lens, the focusing being based on the in-plane geometric aberrations associated with the lens. A related method is also disclosed.

11 Claims, 14 Drawing Sheets

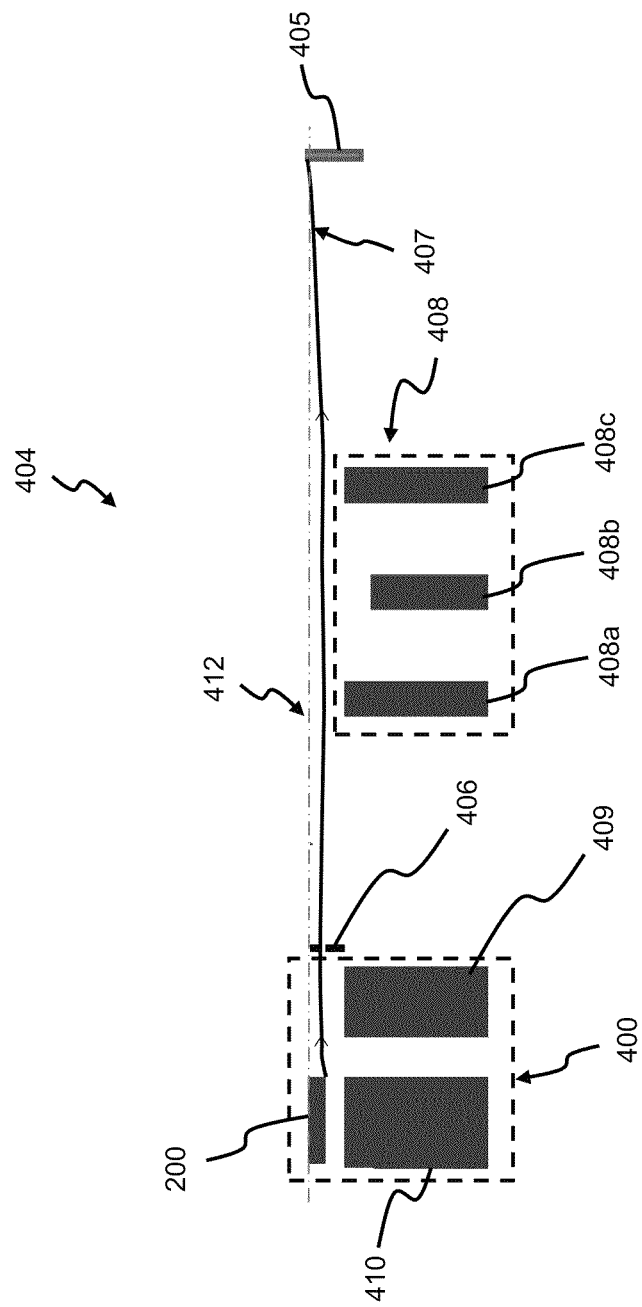

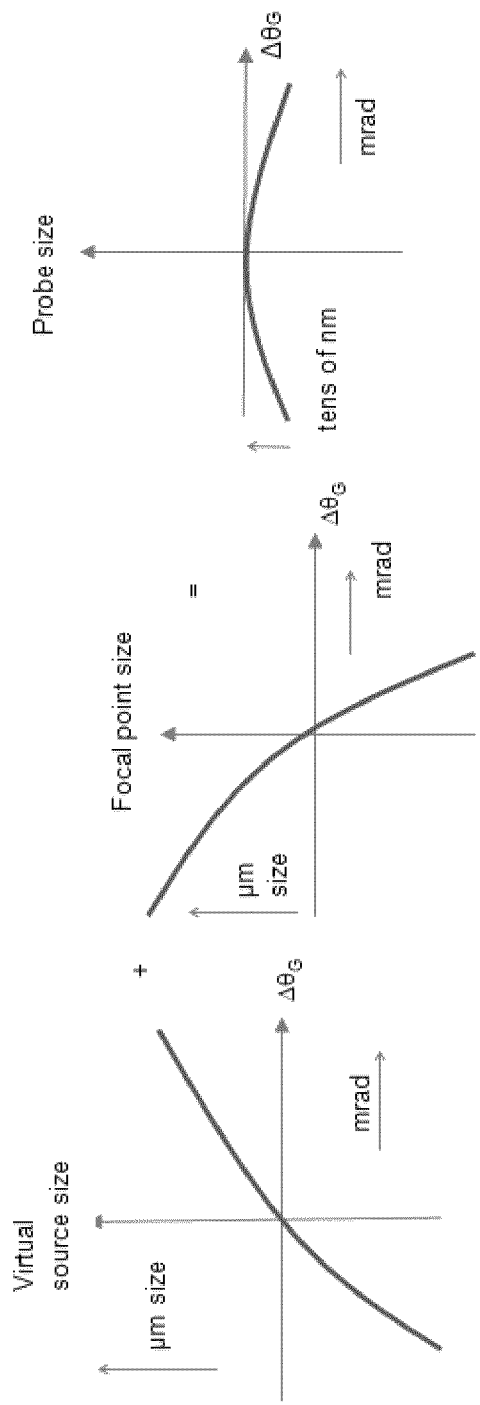

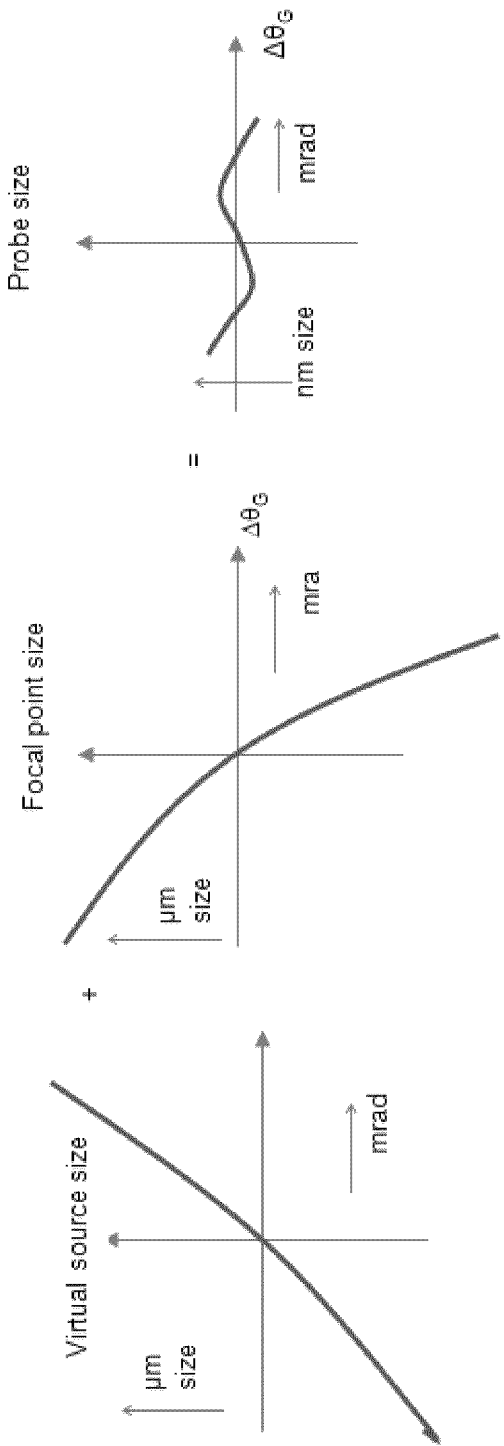

GUN CONFIGURED TO GENERATE CHARGED PARTICLES

BACKGROUND OF THE INVENTION

The present invention relates to a gun configured to generate charged particles.

Nano-size electron emitters (hereinafter nano-emitters) are typically used in some electron gun designs. A type of electron gun design uses a conventional single-tip cathode emitter 100 (i.e. see FIG. 1a), which is commonly adopted for electron microscopy. This type of electron gun design is characterised with smaller effective source sizes, and brightness of one to two orders of magnitude higher than electron guns using larger single-tip emitters, but is however disadvantaged by proportionally lower total beam currents (which are typically in the pico-ampere to tens of nano-ampere range, and thus not useful for Electron Beam Lithography and analytical techniques such as Auger Electron Spectroscopy (AES)), large beam current fluctuations, and more stringent vacuum-operating requirements (i.e. less than 10-10 Torr). In addition, there are associated alignment problems relating to cathode-tip to rotational axis of subsequent lenses.

In another type of electron gun design, the nano-emitters are arranged as an array covering a large area (i.e. thus also known as a large area field emitter array), and the nano-emitters are usually made from CNTs. Large area field emitter arrays have several advantages over the single-tip cathode emitter 100. Specifically, large area field emitter arrays can be manufactured using standard Chemical Vapour Deposition (CVD)/lithography techniques, wherein tens of thousands of nano-emitters can routinely be formed over an area that cover up to several centimeter squared (i.e. cm2), and also large area field emitter arrays are able to output a maximum electrical current density of about 1 A/cm2. Take for instance vertically aligned carbon nano-tube field emission arrays, which typically include sub-micron diameter CNT blocks spaced apart by a few microns, and each CNT block is formed from tens of thousands of nanometer-size CNTs. In this respect, previous studies report obtaining a total probe current of between 0.3 $\mu A$ to 300 $\mu A$ from a large area field emitter array configured with hundred by hundred dots, where each dot is a 5 $\mu m$ high CNT fibre with a diameter of 100 nm at the base of, and 50 nm at the tip of the CNT fibre. It is to be appreciated that the above said level of the probe current reported is typically orders of magnitude higher than a probe current obtainable from a single-tip cathode emitter 100. Moreover, the problem of ion back-bombardment is expected to be much smaller with large area field emitter arrays, due to ions being distributed over a much bigger cathode surface, which means that a large area field emitter array only requires an operating vacuum level of about $10^{-6}$ Torr, being considerably several orders of magnitude lower than that required by conventional cold field emitters.

However, large area field emitter arrays are not suitable for focused beam applications, due to them having a relatively large source. Conventionally, large area field emitter arrays are adopted for applications only where a target area is at least greater than several millimeter squared (i.e. mm2) (e.g. in flat panel displays or X-ray tubes).

One object of the present invention is therefore to address at least one of the problems of the prior art and/or to provide a choice that is useful in the art.

SUMMARY OF THE INVENTION

According to a $1^{st}$ aspect of the invention, there is provided a gun configured to generate charged particles, comprising a ring-cathode electrically configured to generate a charged particle beam; a lens arranged to focus the charged particle beam on a specimen; and at least one correction focusing electrode arranged to generate at least one electrostatic/magnetic field to further divergently/convergently focus the charged particle beam for correcting in-plane geometric aberrations associated with the lens, the focusing being based on the in-plane geometric aberrations associated with the lens.

Advantages of the proposed gun include enabling first-order and higher-order (which includes at least second-order) in-plane geometric aberrations to be cancelled/reduced, thereby allowing high probe current (i.e. greater than 1 $\mu A$) with high spatial resolution (i.e. less than 20 nm) to be attained. Moreover, the proposed gun is able to focus several tens of microamperes of current into probe diameters that measure several tens of nanometers. The method can be used for both field emission and photo-cathode guns.

The ring-cathode may include a block emitter in a ring arrangement.

Preferably, the at least one correction focusing electrode may further include a first electrode arranged adjacent the ring-cathode, and is electrically configurable based on the in-plane geometric aberrations associated with the lens to generate a first electrostatic/magnetic field to further divergently/convergently focus the charged particle beam.

Preferably, the at least one correction focusing electrode may further include first and second electrodes, the first electrode arranged along the rotational axis of the gun, and is electrically biased at 0 V, the second electrode arranged to surround the first electrode and being electrically configurable based on the in-plane geometric aberrations associated with the lens to generate a first electrostatic/magnetic field to further divergently/convergently focus the charged particle beam.

Preferably, the at least one correction focusing electrode may further include a first electrode arranged adjacent the ring-cathode, and is electrically configurable based on the in-plane geometric aberrations associated with the lens to generate a first electrostatic/magnetic field to further divergently/convergently focus the charged particle beam, and second and third electrodes, the second electrode arranged along the rotational axis of the gun, and is electrically biased at 0 V, the third electrode arranged to surround the second electrode and being electrically configurable based on the in-plane geometric aberrations associated with the lens to generate a second electrostatic/magnetic field to further divergently/convergently focus the charged particle beam.

In addition, the charged particle beam may include an electron or ion beam. The lens may include an electrostatic lens.

According to a $2^{nd}$ aspect of the invention, there is provided a focused electron/ion beam column comprising the gun based on the $1^{st}$ aspect of the invention.

According to a $3^{rd}$ aspect of the invention, there is provided a method of operating a gun configured to generate charged particles, comprising providing a ring-cathode; generating a charged particle beam from the ring-cathode; providing a lens and using the lens to focus the charged particle beam on a specimen; and generating at least one electrostatic/magnetic field to further divergently/convergently focus the charged particle beam for correcting in-plane geometric aberrations associated with the lens, the focusing being based on the in-plane geometric aberrations associated with the lens.

According to a $4^{th}$ aspect of the invention, there is provided a method for in-plane geometric aberration reduction of a focused electron/ion beam column that uses a ring-cathode source, the ring-cathode source being arranged as a ring centered on the rotational axis of the said column, wherein at least some electrons/ions are continuously emitted along the in-plane direction of the ring-cathode source.

According to a $5^{th}$ aspect of the invention, there is provided a method for first-order in-plane geometric aberration correction, wherein the in-plane first-order geometric aberration of a divergent lens element in a focused electron/ion beam column, such as a ring-cathode gun unit, cancels out first-order in-plane geometric aberrations contributions from a convergent lens element in the said column, such as that from an objective lens, and wherein the residual in-plane geometric aberration at a specimen is of second-order.

Preferably, the method may further comprises incorporating an on-axis electrode corrector unit in the said column that provides a second-order in-plane geometric aberration divergent lens action, which, in tandem with the first-order in-plane geometric aberration, is able to cancel out convergent lens second-order in-plane geometric aberration elements in the said column, such as that from the said objective lens, and reduce the total geometric in-plane aberration at the specimen to third-order.

According to a $6^{th}$ aspect of the invention, there is provided a ring-cathode electrically configured to generate a charged particle beam.

According to a $7^{th}$ aspect of the invention, there is provided a gun configured to generate charged particles, comprising a ring-cathode electrically configured to generate a charged particle beam; a lens arranged to focus the charged particle beam on a specimen; and at least one correction focusing electrode arranged to generate at least one electrostatic/magnetic field to focus the charged particle beam for correcting in-plane geometric aberrations associated with the lens, the focusing being based on the in-plane geometric aberrations associated with the lens.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 3 includes FIGS. 3a to 3d, in which FIGS. 3a and 3b are schematic diagrams depicting electron emission respectively for the single-tip cathode emitter of FIG. 1a, and the ring-cathode of FIG. 2, whereas

FIG. 4 includes FIGS. 4a to 4c, in which

FIGS. 7b to 7e collectively show a method of cancelling/reducing higher-order in-plane geometric aberrations, according to the embodiment mentioned in FIG. 7a;

DETAILED DESCRIPTION OF PREFERRED EMBODIMENTS

First Order Geometric Aberration Correction

Figure 1:
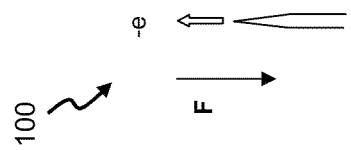
FIG. 1 is a schematic diagram of a single-tip cathode emitter, according to the prior art.
Figure 2:
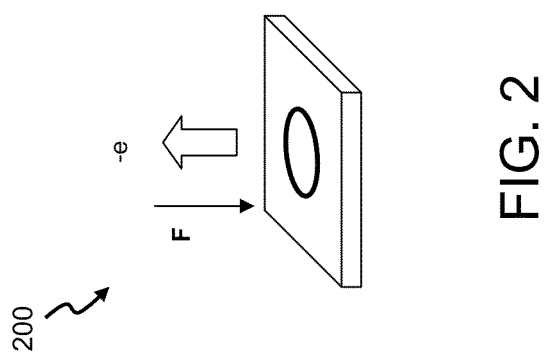
FIG. 2 shows a schematic diagram of a ring-cathode emitter (i.e. ring-cathode), according to an embodiment of the invention.
Figure 3A:
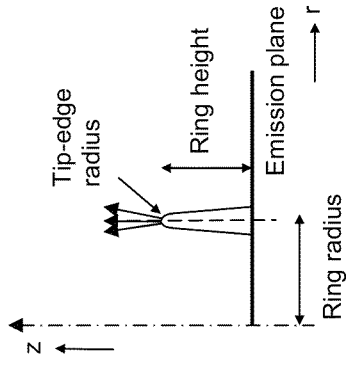
Figure 3B:
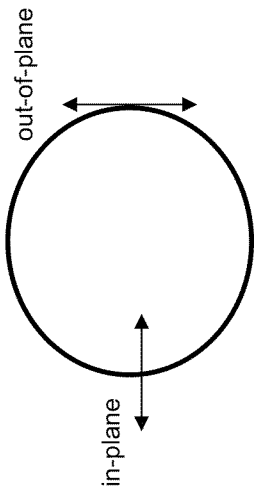
Figure 3C:
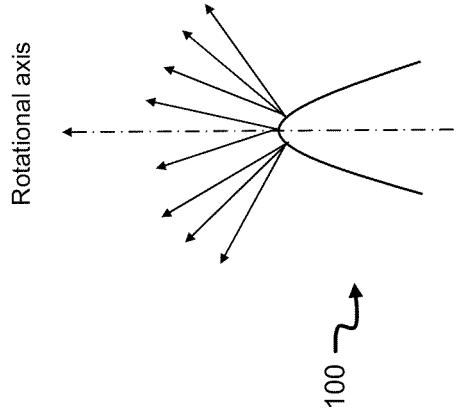
FIGS. 3c and 3d show in-plane and out-of-plane electron emission from the ring-cathode of FIG. 2.
Figure 3D:
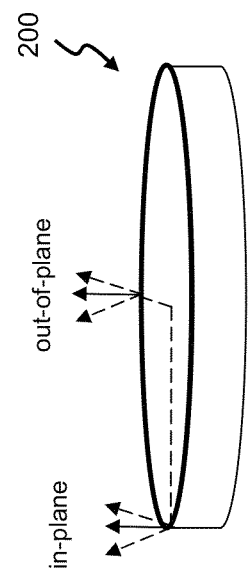

FIG. 2 shows a schematic diagram of a ring-cathode emitter 200 (hereinafter ring-cathode) operating in a virtual source mode, according to a first embodiment of the invention. The ring-cathode is an emission source electrically configured to emit a charged particle beam (comprising ion/electrons). In particular, the ring-cathode 200 is formed from a single nano-thick block emitter and configured as a ring arrangement, which is rotationally symmetrical from the perspective of a plane view of the ring-cathode 200. Also, the ring-cathode 200 has a radius of "R". FIG. 3a shows a schematic diagram of a side view of electron emissions emanating omni-directionally from the tip of the single-tip cathode emitter 100 of FIG. 1a (which is prior art), whereas FIG. 3b shows electron emissions generated and emanating from the tip of the block emitter used for the ring-cathode 200, but in a direction substantially along the Z-axis of the block emitter. The Z-axis of the block emitter is defined to be parallel to the longitudinal axis of the block emitter. There is also an R-axis which is orthogonal to the Z-axis. In connection, FIGS. 3c and 3d respectively shows a perspective view and a plan view of in-plane and out-of-plane electron emissions emanating from the emission plane of the ring-cathode 200. The emission plane of the ring-cathode 200 is a flat plane on which the block emitter is arranged, and also on which the R-axis lies. Accordingly, it is to be appreciated that the in-plane electron emissions emanate in a direction substantially parallel to the Z-axis, while the out-of-plane emissions emanate tangentially to the circumference of the ring-cathode 200 (and thus lie on the emission plane of the ring-cathode 200).

Figure 4A:
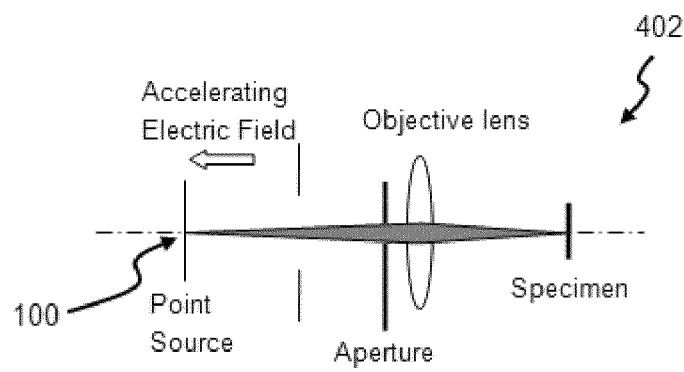
FIG. 4a depicts schematics of a conventional focused electron beam column using the single-tip cathode emitter of FIG. 1a, and FIGS. 4b and 4c depict schematics of a focused electron beam column which incorporates an electron gun having the ring-cathode of FIG. 2.
Figure 4B:
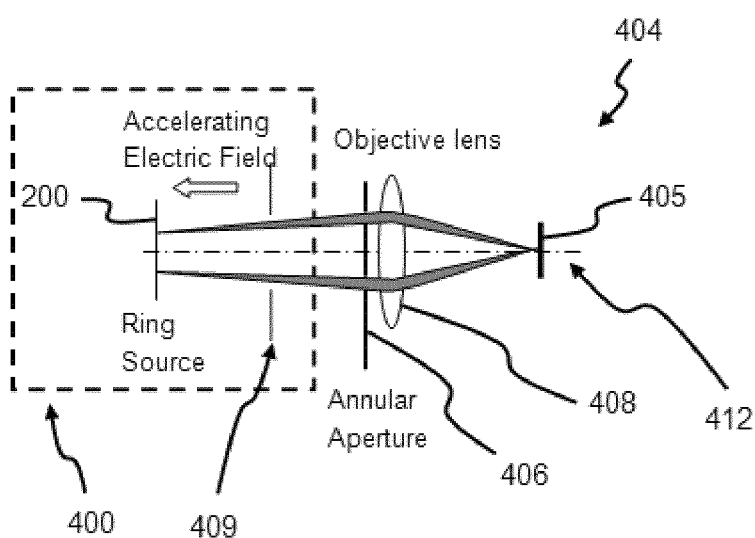

FIG. 4a depict a layout of a conventional focused electron beam column 402 which uses the single-tip cathode emitter 100 of FIG. 1a, while FIG. 4b shows a layout of a focused electron beam column 404 (being used to investigate a specimen 405) which uses an electron gun 400 (as represented by a box indicated by dotted lines in FIG. 4b) as per the present embodiment, and also includes a disk 406 with an annular aperture (to restrict spreading of the electron beam), and an objective electrostatic lens 408 (e.g. an electric Einzel lens). The electron beam emitted by the ring-cathode 200 is indicated by reference numeral 407. It is to be appreciated that the focused electron beam column 404 of FIG. 4b is particularly set up to correct first order in-plane geometric aberration.

FIG. 4c is a more detailed schematic diagram of the focused electron beam column 404 of FIG. 4b, in which only a rotational half of the focused electron beam column 404 is depicted for illustration simplicity. It is to be appreciated that the disk 406 with annular aperture is arranged intermediate the electron gun 400 and the objective electrostatic lens 408. The electron gun 400 comprises a gun anode 409 (which is biased at 0 V), an electrode known as a suppressor electrode 410, and the ring-cathode 200. The suppressor electrode 410 is arranged adjacent the emission plane of the ring-cathode 200, and is electrically biased at a voltage of $V_S$ (e.g. −10.5 kV) to generate an electrostatic field to convergently focus electrons emanated from the ring-cathode 200. The voltage $V_S$ may be adjustable as required. In particular, the voltage $V_S$ is adjusted based on the in-plane geometric aberrations of the objective electrostatic lens 408. The suppressor electrode 410 enables precise control of the gun exit angle of the electron beam, and functions as a correction focusing electrode. It is to be appreciated that the gun exit angle is defined relative to the rotational axis 412 of the electron gun 400. Further, it is to be appreciated that the objective electrostatic lens 408 comprises first, second and third electrodes 408a, 408b, 408c to collimate electrons, in which the focusing action of the objective electrostatic lens 408 is controlled by the second electrode 408b which is biased at a voltage of $V_F$. The first, second and third electrodes 408a, 408b, 408c are each cylindrically-shaped. The second electrode 408b is arranged intermediate the first and third electrodes 408a, 408c, which are both biased at 0 V.

Importantly, the electron gun 400 is arranged to incorporate the said ring-cathode 200 which is biased at a potential of $-V_G$ (e.g. −10 kV). Thus, an accelerating electric field is set up between the gun anode 409 and the ring-cathode 200 to accelerate the electrons emitted by the ring-cathode 200, and it is to be appreciated that the emission of the electrons from the ring-cathode 200 is off-axis relative to the rotational axis 412 of the electron gun 400. Also, in FIG. 4b, the emission plane of the ring cathode 200 is arranged perpendicular to the rotational axis 412 of the electron gun 400, and thus said rotational axis 412 orthogonally intersects the centre of the ring-cathode 200. It is to be appreciated that for the arrangement in FIG. 4b, the electron gun 400 and the focused electron beam column 404 share the same rotational axis 412. Hence, it is also to be appreciated that the focused electron beam column 404 is rotationally symmetrical along the rotational axis 412 of the electron gun 400.

Figure 5A:
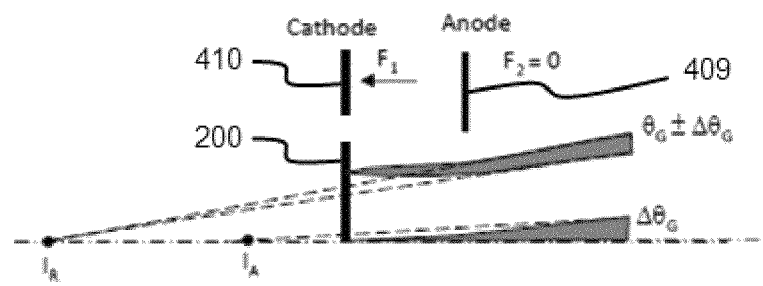
FIG. 5 includes FIGS. 5a and 5b which collectively show dependency of virtual source size on the ring-emitter gun exit semi-angular spread $\Delta\theta_G$.
Figure 5B:
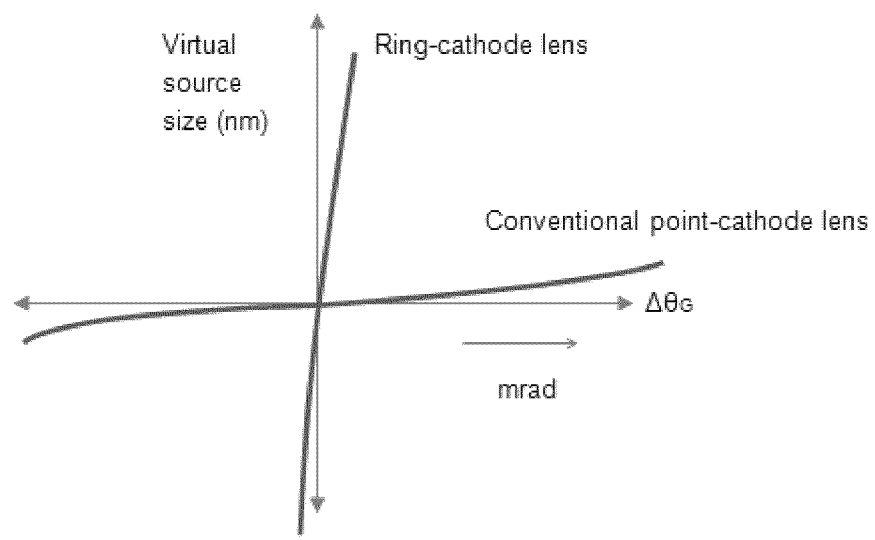
Figure 6A:
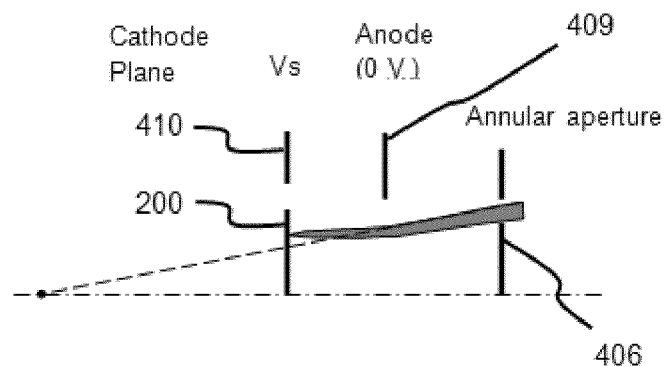
FIG. 6 includes FIGS. 6a to 6e, which collectively show a method of cancelling/reducing first-order in-plane geometric aberrations based on use of the focused electron beam column layout of FIG. 4b.
Figure 6B:
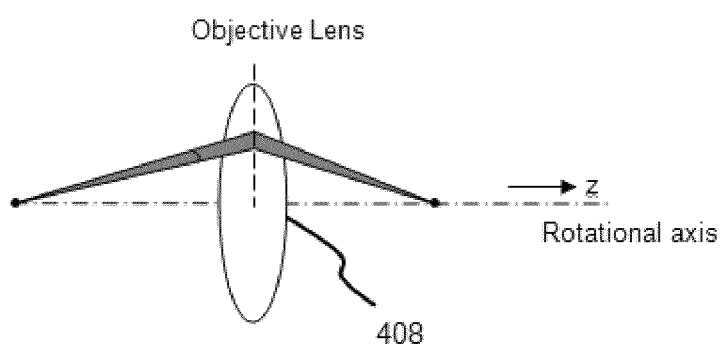

FIGS. 5a and 5b collectively show dependency of a virtual source size on gun exit semi-angular spread, $\Delta\theta_G$. Particularly, the ring-cathode 200 has geometrical aberrations being of one to two orders magnitude worse than an on-axis point source. Similarly, aberrations from the objective electrostatic lens 408 (of the focused electron beam column 404 shown in FIG. 4c) in focusing a ring of electron beam are more than an order of magnitude worse than a beam of electrons travelling directly around on-axis. The reason is because the geometric aberrations now involve a ring semi-angle $\theta_G$ as well as the angular spread $\Delta\theta_G$, (i.e. $\theta_G \gg \Delta\theta_G$). Further, the radius of geometric aberration, instead of being proportional to $(\Delta\theta_G)^3$, is now proportional to $\theta_G(\Delta\theta_G + \theta_G)^2$. Thus it will be appreciated that the geometric aberration of $\theta_G(\Delta\theta_G + \theta_G)^2$ is dominated by a large linear term in $\Delta\theta_G$, which in the case of a point source is zero in value. Hence, this is a reason why a ring-based source (e.g. the proposed ring-cathode 200) is typically not considered for use in a focused electron/ion beam column.

FIGS. 6a to 6e show a schematic representation of how first-order geometric in-plane aberration cancellation is achieved. The ring-cathode gun lens, shown in FIG. 6a, has in-plane geometric virtual source size aberrations of the kind depicted in FIG. 6c, where the virtual source size is a function of the angular spread in the beam. Apart from the higher-order aberrations of this dependence, the curve of FIG. 6c has a positive gradient, positive first-order component, and a negative curvature, that is, a negative second-order component. The objective lens 408, shown in FIG. 6b, has in-plane geometric focal point aberrations of the kind depicted in FIG. 6d, which as a negative first-order component (negative gradient), and a negative second-order component (negative curvature). By adjustment of the focusing action of the suppressor electrode 410 in the gun lens (i.e. via the potential of $V_S$), the first order components of the gun lens and the objective electrostatic lens 408 can be made to be of equal magnitude, and therefore made to cancel, leaving residual second-order components. A size of a final spot of the electron beam is thus reduced from tens of microns size to tens of nanometers size through this first-order cancellation method.

Further embodiments of the invention will be described hereinafter. For the sake of brevity, description of like elements, functionalities and operations that are common between the embodiments are not repeated; reference will instead be made to similar parts of the relevant embodiment (s).

Second and Higher-Order Geometric Aberration Correction

Figure 7A:
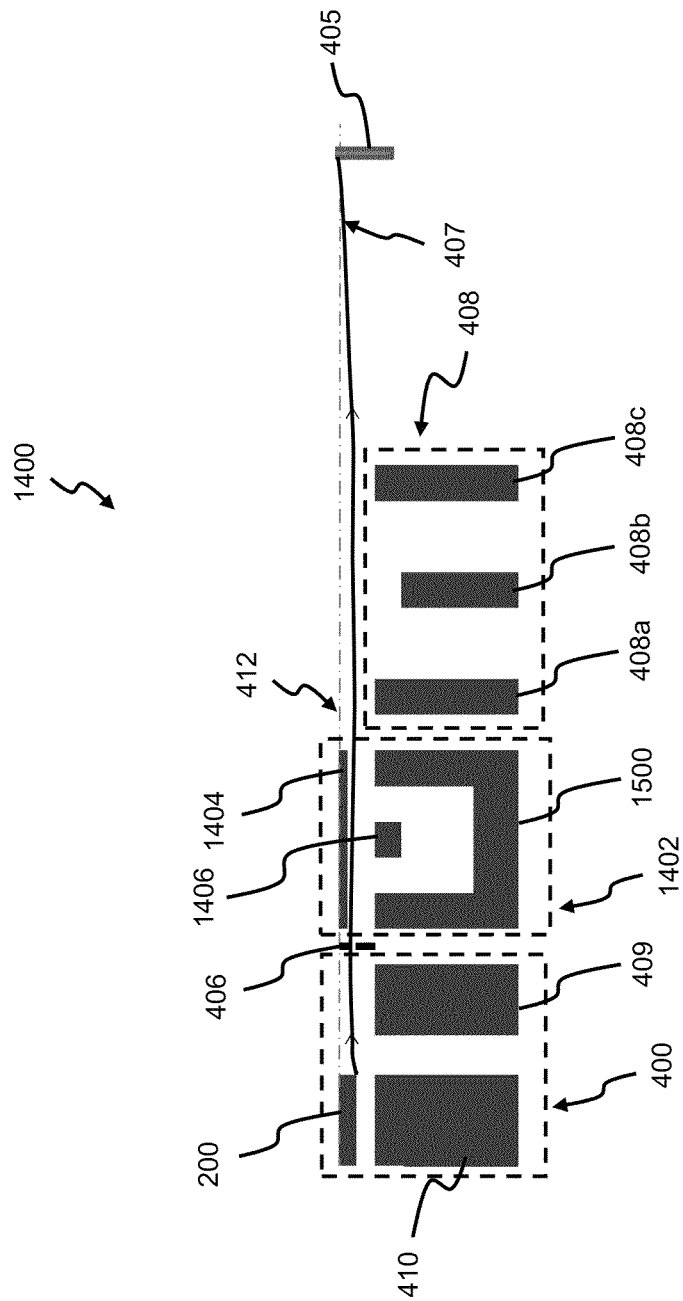
FIG. 7a depicts schematics of a focused electron beam column arranged to cancel/reduce higher-order in-plane geometric aberrations, according to another embodiment.

According to a second embodiment, FIG. 7a shows schematics of another focused beam electron column 1400 which is set up for cancellation/reduction of second and higher-order in-plane geometric aberration. It is to be appreciated that the focused beam electron column 1400 in FIG. 7a is largely the same as that shown in FIG. 4c, except that a corrector focusing device 1402 is now additionally included. It is to be highlighted that only a rotational half of the focused electron beam column 1400 is depicted in FIG. 7a for illustration simplicity (which is similar to as per FIG. 4c).

The corrector focusing device 1402 is arranged intermediate to the electron gun 400 and the objective electrostatic lens 408 to receive the electron beam generated from the emission plane of the ring-cathode 200. The corrector focusing device 1402 comprises an on-axis electrode 1404 electrically biased at 0 volt, and the on-axis electrode 1404 is arranged to be surrounded by a cylindrically-shaped correction focusing electrode 1406. Both the on-axis electrode 1404 and the correction focusing electrode 1406 are then arranged within a housing 1500 of the corrector focusing device 1402. The on-axis electrode 1404 has a width of about 1.5 mm (as an example), and the housing 1500 is biased at 0 V. The correction focusing electrode 1406 is biased at a voltage, $V_C$, which is to be appropriately adjusted (to generate an electrostatic field) based on in-plane geometric aberrations of the objective electrostatic lens 408 as used in the focused electron/ion beam column 1400 of FIG. 7a. It is to be appreciated that the definition of the on-axis electrode 1404 means that the on-axis electrode 1404 is arranged to lie along the rotational axis of the focused electron/ion beam column 1400 (and thus consequently also the electron gun 400).

Specifically, the corrector focusing device 1402 is arranged to generate a radial electrostatic field to vary the trajectory path of the electron beam divergently. The radial electrostatic field generated has an effect of a divergent lens, where electrons travelling at small radii experience a greater divergent force than electrons travelling at larger radii, which is in an opposite manner to how an objective lens typically focuses electrons. Hence, the function performed by the corrector focusing device 1402 enables higher-order geometric aberrations to be corrected or cancelled. The definition of higher-order means higher than first-order.

Figure 7B:
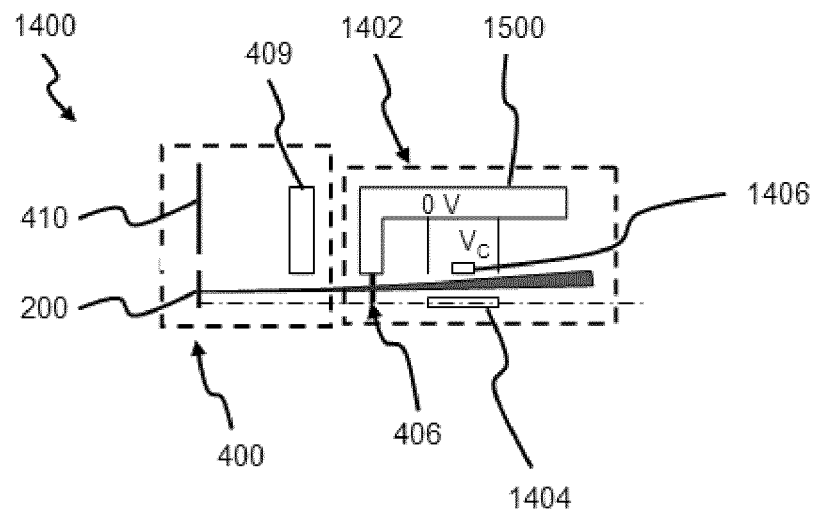
Figure 7C:
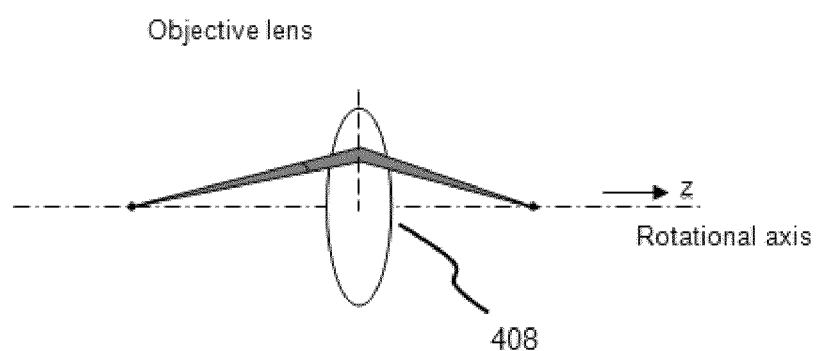

In accordance with the second embodiment, FIGS. 7b to 7f show a schematic representation of how second-order geometric in-plane aberration cancellation is achieved. In this case, the gun lens in-plane geometric aberrations are combined with the corrector focusing device 1402, as shown in FIG. 7b, which is able to change its in-plane geometric aberration curvature to be a positive one, as shown in FIG. 7d. The focusing strength of the corrector focusing device 1402 is adjusted using the correction focusing electrode 1406 (being biased at the voltage of $V_C$), which surround the 0 volt on-axis electrode 1404. By simultaneously adjusting the voltages $V_S$ and $V_C$ respectively of the suppressor electrode 410 and the correction focusing electrode 1406, both the first and second-order in-plane geometric aberrations of the gun lens can be made to cancel the first and second-order in-plane geometric aberrations of the objective electrostatic lens 408, leaving residual third-order and higher order in-plane geometric components. A final point spot size of the electron beam in this case, is reduced from tens of microns size to a few nanometers size through this first and second-order cancellation method. It is to be appreciated that in this embodiment, the definition of correction focusing electrode thus also includes the suppressor electrode 410.

Figure 8:
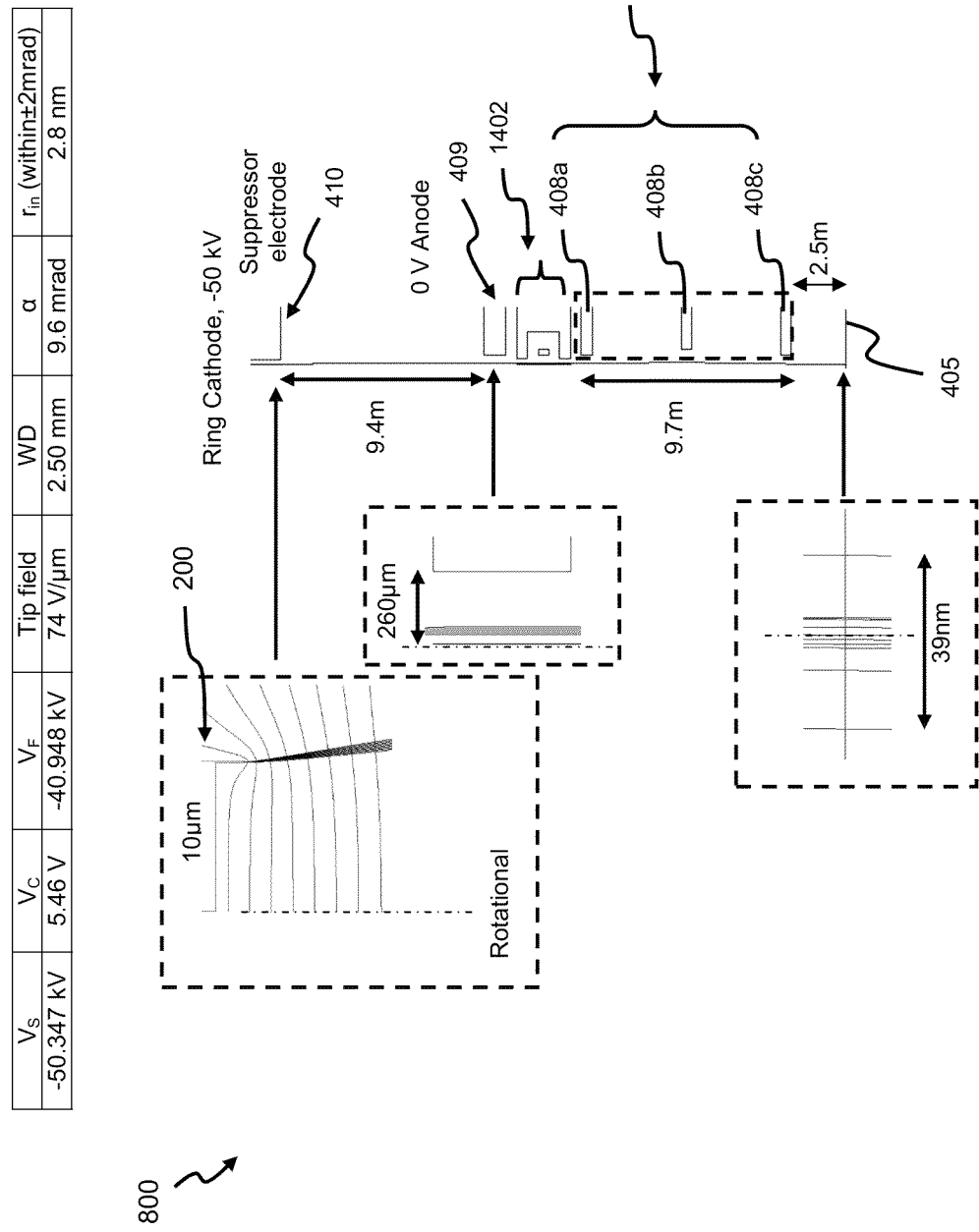
FIG. 8 show an example evaluation setup of a focused electron beam operated based on the method of FIGS. 7b to 7e.
Figure 9A:
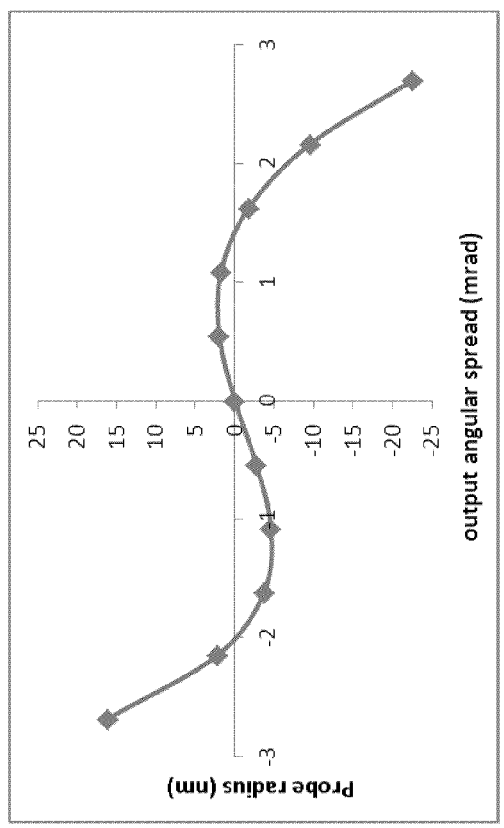
FIGS. 9a and 9b show related simulation results obtained for the example evaluation setup of FIG. 8.
Figure 9B:
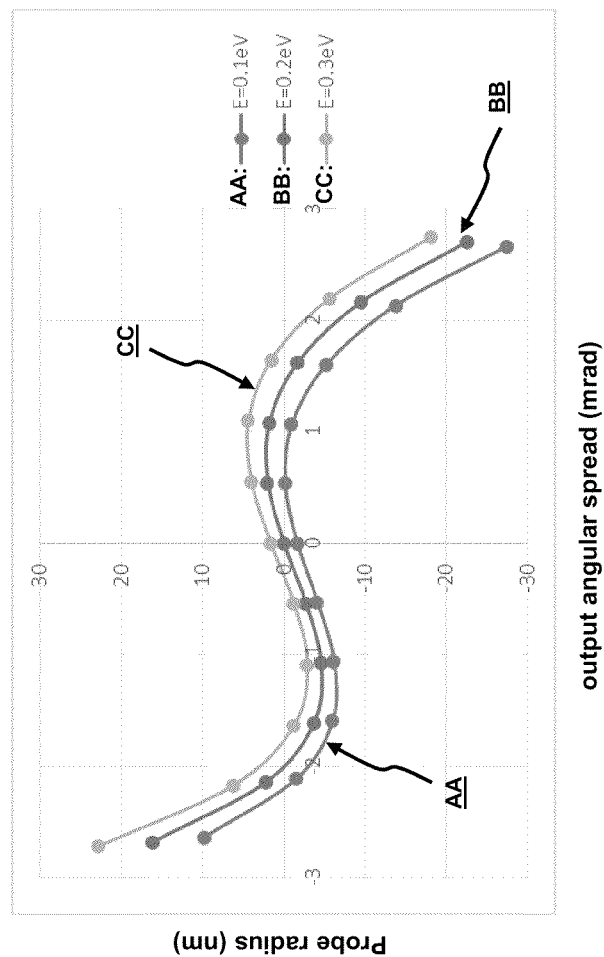

FIG. 8 show schematics of an example evaluation setup 800 based on the focused electron/ion beam column 1400 of FIG. 7a, whilst FIGS. 9a and 9b show related simulation results obtained. In this instance in FIG. 8, the ring-cathode 200 (configured at a voltage of −50 kV) is arranged to be about 9.4 mm from the gun anode 409, and the objective electrostatic lens 408 is about 9.7 mm long, which is in turn spaced at about 2.5 mm from the specimen 405. Further, in this case, the ring-cathode 200 has a radius of 10 μm, and the tip height of the block emitter of the ring-cathode 200 is about 2 μm. The suppressor electrode 410 is arranged spaced from the rotational axis of the electron gun 1400 by about 260 μm. For this example evaluation setup 800 of FIG. 8, it is found that for a −2 mrad to 2 mrad angular spread at the specimen 405, the spot diameter is contained to within 39 nm, and an optimum RMS (Root Mean Square) probe radius of 2.8 nm is predicted. These simulation results were made for the following conditions: $V_G$ is set to −50 kV, $V_S$ is set to −50.347 kV, $V_F$ is set to −40.948 kV, $V_C$ is set to 5.46 V, the tip field is set to 74 V/μm (wherein the tip field is the electric field strength at the tip of the ring-cathode 200), the WD is set to 2.50 mm (wherein WD represents the working distance from the third electrode 408c of the objective electrostatic lens 408 to a point of focus of the specimen 405), α is set to 9.6 mrad (wherein α represents the ring-semi angle $\theta_G$), and $r_{in}$ represents the RMS simulated in-plane radius of the focused electron/ion beam column 1400. FIG. 9b shows a simulated RMS 4 nm chromatic aberration radius (increased from 2.8 nm to 4.0 nm) being obtained for an energy spread ranging from 0.1 eV to 0.3 eV.

For completeness, it is to be appreciated that all simulation results as afore discussed in the described embodiments are generated using customised software based on the Lorentz-2EM™ software package. Briefly, the said customised software uses finite element field to solve for electric/magnetic field distributions and Runge-Kutta ray tracing techniques to plot flight paths of electrons.

In summary, the proposed focused electron/ion beam columns 404, 1400 incorporates the ring-cathode 200 (in the proposed electron gun 400) which is configured to have a nano-sized ring-edge thickness (e.g. about 50 nm), while the radius of the ring-cathode 200 may be arranged to be around hundreds of microns or larger to provide an area of emission that is several orders of magnitude greater than that provided by conventional field emission cathodes. The ring-cathode 200 comprises a single nano-thick circular block emitter. Advantages of using the ring-cathode 200 include overcoming inherent current limit/instabilities, difficulties in manufacturing, and easing on stringent vacuum-operating requirements, all of which are encountered in usage of single tip cold field emitters. In addition, the corrector focusing device 1402 and the suppressor electrode 410 are included into the proposed focused electron/ion beam column 1400 of the second embodiment. The correction focusing electrode 1406 of the corrector focusing device 1402 and suppressor electrode 410 are configurable by way of adjusting respective biasing potentials of the associated electrodes in order to generate appropriate electrostatic fields to respectively divergently/convergently focus an electron beam generated by the ring-cathode 200 for correcting/compensating in-plane geometric aberrations associated with the electrostatic lens. The biasing potentials are configured based on the in-plane geometric aberrations associated with the electrostatic lens used. Accordingly, using methods of first-order and higher-order geometric aberrations correction, evaluation simulations conducted using direct ray tracing show that the proposed focused electron/ion beam columns are capable of achieving high probe current (i.e. greater than 1 μA) with high spatial resolution (i.e. less than 20 nm). Moreover, the proposed focused electron/ion beam columns are able to focus several tens of microamperes of current into probe diameters that measure several tens of nanometers. It is further to be appreciated that the proposed methods can be used for both field emission and photo-cathode guns.

The described embodiments should not however be construed as limitative. For example, the corrector focusing device 1402 and suppressor electrode 410 may be used separately and need not be used together (i.e. either one may be omitted based on an intended application). Further, the corrector focusing device 1402 may also be arranged intermediate the objective electrostatic lens 408 and the specimen 405, which is alternative to the arrangement described in the second embodiment. The objective electrostatic lens 408 may also be replaced by an appropriate magnetic lens. In addition, the correction focusing electrode 1406 of the corrector focusing device 1402 and suppressor electrode 410 may be configured to generate respective magnetic fields, instead of the electrostatic fields, for focusing the electron/ion beam. It is also to be appreciated that the correction focusing electrode 1406 of the corrector focusing device 1402 and suppressor electrode 410 may further be independently configured to divergently/convergently focus the electron/ion beam, depending on requirements of an intended application.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

The invention claimed is:
1. A gun configured to generate charged particles, comprising:
  a ring-cathode electrically configured to generate a charged particle beam;
  a lens arranged to focus the charged particle beam on a specimen; and
  at least one correction focusing electrode arranged to generate at least one electrostatic/magnetic field to further divergently/convergently focus the charged particle beam for correcting in-plane geometric aberrations associated with the lens, the focusing being based on the in-plane geometric aberrations associated with the lens.

2. The gun of claim 1, wherein the ring-cathode includes a block emitter in a ring arrangement.

3. The gun of claim 1, wherein the at least one correction focusing electrode further includes a first electrode arranged adjacent the ring-cathode, and is electrically configurable based on the in-plane geometric aberrations associated with the lens to generate a first electrostatic/magnetic field to further divergently/convergently focus the charged particle beam.

4. The gun of claim 1, wherein the at least one correction focusing electrode further includes first and second electrodes, the first electrode arranged along the rotational axis of the gun, and is electrically biased at 0 V, the second electrode arranged to surround the first electrode and being electrically configurable based on the in-plane geometric aberrations associated with the lens to generate a first electrostatic/magnetic field to further divergently/convergently focus the charged particle beam.

5. The gun of claim 1, wherein the at least one correction focusing electrode further includes:
a first electrode arranged adjacent the ring-cathode, and is electrically configurable based on the in-plane geometric aberrations associated with the lens to generate a first electrostatic/magnetic field to further divergently/convergently focus the charged particle beam,
second and third electrodes, the second electrode arranged along the rotational axis of the gun, and is electrically biased at 0 V, the third electrode arranged to surround the second electrode and being electrically configurable based on the in-plane geometric aberrations associated with the lens to generate a second electrostatic/magnetic field to further divergently/convergently focus the charged particle beam.

6. The gun of claim 1, wherein the charged particle beam includes an electron or ion beam.

7. The gun of claim 1, wherein the lens includes an electrostatic lens.

8. A focused electron/ion beam column comprising the gun of claim 1.

9. A method of operating a gun configured to generate charged particles, comprising:
providing a ring-cathode;
generating a charged particle beam from the ring-cathode;
providing a lens and using the lens to focus the charged particle beam on a specimen; and
generating at least one electrostatic/magnetic field to further divergently/convergently focus the charged particle beam for correcting in-plane geometric aberrations associated with the lens, the focusing being based on the in-plane geometric aberrations associated with the lens.

10. A method for first-order in-plane geometric aberration correction comprising: configuring the first-order in-plane geometric aberration of a divergent lens element in a focused electron/ion beam column, such as a ring-cathode gun unit, to cancel out first-order in-plane geometric aberrations contributions from a convergent lens element in the said column, such as that from an objective lens, wherein the residual in-plane geometric aberration at a specimen is of second-order.

11. The method of claim 10, wherein the said column further comprises an on-axis electrode corrector unit adapted to provide a second-order in-plane geometric aberration divergent lens action, the method further includes configuring the second-order in-plane geometric aberration divergent lens action in tandem with the first-order in-plane geometric aberration to cancel out convergent lens second-order in-plane geometric aberration elements in the said column, such as that from the said objective lens, to cause the total geometric in-plane aberration at the specimen to be reduced to third-order.

* * * * *